(12) United States Patent
Tsai et al.

(10) Patent No.: US 8,975,734 B2
(45) Date of Patent: Mar. 10, 2015

(54) SEMICONDUCTOR PACKAGE WITHOUT CHIP CARRIER AND FABRICATION METHOD THEREOF

(75) Inventors: Yueh-Ying Tsai, Taichung (TW); Fu-Di Tang, Taichung (TW); Chien-Ping Huang, Taichung (TW); Chun-Chi Ke, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 1121 days.

(21) Appl. No.: 12/967,839

(22) Filed: Dec. 14, 2010

(65) Prior Publication Data
US 2012/0007234 A1 Jan. 12, 2012

(30) Foreign Application Priority Data

Jul. 12, 2010 (TW) .............................. 99122791 A

(51) Int. Cl.
*H01L 23/02* (2006.01)
*H01L 21/48* (2006.01)
(Continued)

(52) U.S. Cl.
CPC ............ *H01L 21/486* (2013.01); *H01L 21/565* (2013.01); *H01L 23/3142* (2013.01); *H01L 24/11* (2013.01); *H01L 24/81* (2013.01); *H01L 21/568* (2013.01); *H01L 24/16* (2013.01); *H01L 24/48* (2013.01); *H01L 2224/16227* (2013.01); *H01L 2224/32225* (2013.01); *H01L 2224/48091* (2013.01); *H01L 2224/48227* (2013.01); *H01L 2224/48235* (2013.01); *H01L 2224/48247* (2013.01); *H01L 2224/484* (2013.01); *H01L 2224/73265* (2013.01);
(Continued)

(58) Field of Classification Search
USPC ......... 257/678, 681, 684, 690, 701, 704, 666, 257/673, 734, 735, 737, 762, 787, E21.006, 257/E21.007, E21.058, E21.205, E21.499, 257/E21.502, E21.503, E21.504, E21.505, 257/E21.506, E21.508, E21.509, E21.511
See application file for complete search history.

(56) References Cited

U.S. PATENT DOCUMENTS 5,830,800 A * 11/1998 Lin ................................ 438/459
6,498,099 B1 12/2002 McLellan et al.
(Continued)

*Primary Examiner* — David Nhu
(74) *Attorney, Agent, or Firm* — Mintz Levin Cohn Ferris Glovsky and Popeo, P.C.; Peter F. Corless; Steven M. Jensen

(57) ABSTRACT

A semiconductor package without a chip carrier formed thereon and a fabrication method thereof. A metallic carrier is half-etched to form a plurality of grooves and metal studs corresponding to the grooves. The grooves are filled with a first encapsulant and a plurality of bonding pads are formed on the metal studs. The first encapsulant is bonded with the metal studs directly. Each of the bonding pads and one of the metal studs corresponding to the bonding pad form a T-shaped structure. Therefore, bonding force between the metal studs and the first encapsulant is enhanced such that delamination is avoided. Die mounting, wire-bonding and molding processes are performed subsequently. Since the half-etched grooves are filled with the first encapsulant, the drawback of having pliable metallic carrier that makes transportation difficult to carry out as encountered in prior techniques is overcome, and the manufacturing cost is educed by not requiring the use of costly metals as an etching resist layer.

19 Claims, 8 Drawing Sheets

(51) Int. Cl.
*H01L 21/56* (2006.01)
*H01L 23/31* (2006.01)
*H01L 23/00* (2006.01)

(52) U.S. Cl.
CPC ................ *H01L 2224/81395* (2013.01); *H01L 2224/81439* (2013.01); *H01L 2224/83395* (2013.01); *H01L 2224/83439* (2013.01); *H01L 2224/85001* (2013.01); *H01L 2224/85395* (2013.01); *H01L 2224/85439* (2013.01); *H01L 2924/01028* (2013.01); *H01L 2924/01029* (2013.01); *H01L 2924/01046* (2013.01); *H01L 2924/01078* (2013.01); *H01L 2924/01079* (2013.01); *H01L 2924/15311* (2013.01); *H01L 2924/00014* (2013.01); *H01L 2224/16225* (2013.01)

USPC .... 257/678; 257/762; 257/734; 257/E21.006; 257/E21.007; 257/E21.058; 257/E21.205; 257/E21.499; 257/E21.502; 257/E21.504; 257/E21.505; 257/E21.506; 257/E21.508; 257/E21.509; 257/E21.511

(56) References Cited

U.S. PATENT DOCUMENTS

| | | | |
|---|---|---|---|
| 6,700,188 B2 | 3/2004 | Lin | |
| 6,770,959 B2 | 8/2004 | Huang et al. | |
| 6,872,661 B1 | 3/2005 | Kwan et al. | |
| 6,933,594 B2 | 8/2005 | McLellan et al. | |
| 6,989,294 B1 | 1/2006 | McLellan et al. | |
| 7,858,441 B2 * | 12/2010 | Lin et al. | 438/109 |
| 8,445,323 B2 * | 5/2013 | Lin et al. | 438/109 |

* cited by examiner

SEMICONDUCTOR PACKAGE WITHOUT CHIP CARRIER AND FABRICATION METHOD THEREOF

CROSS-REFERENCES TO RELATED APPLICATIONS

This application claims under 35 U.S.C. §119(a) the benefit of Taiwanese Application No. 099122791, filed Jul. 12, 2010, the entire contents of which is incorporated herein by reference.

TECHNICAL FIELD

The present invention relates to semiconductor packaging techniques, and more particularly to a semiconductor package without a chip carrier and a fabrication method thereof.

BACKGROUND ART

Conventionally, there are a great variety of semiconductor packages using leadframes as chip carriers, such as quad flat non-leaded (QFN) semiconductor package. The characteristic feature of this QFN semiconductor package is that, unlike a quad flat package (QFP), it does not have external leads being formed outside the package for electrically connecting with external devices, thereby reducing the dimension of the semiconductor packages. However, with the semiconductor product being striven towards miniaturization continuously, limited by the thickness of an encapsulant, the overall thickness of the conventional leadframe QFN semiconductor package may not be further reduced, therefore the industry has developed a semiconductor package without a chip carrier, which is capable of making overall thickness of the semiconductor package without the chip carrier more lightweight than conventional leadframe QFN semiconductor package.

Referring to FIG. 1, a non-carrier type semiconductor package disclosed by U.S. Pat. No. 5,830,800 is illustrated herein. The semiconductor package is formed by first forming a plurality of pads 12 on a copper carrier (not shown in FIG. 1). Then, a chip 13 is mounted on the copper carrier and electrically connected to the pads 12 via bonding wires 14. After that, an encapsulant 15 is formed by a molding process, and then the copper carrier is removed by etching to expose the pads. Then a solder mask 11 is used to define positions of the pads for implanting solder balls on thereof. In such ways, the semiconductor package without a chip carrier is formed. The related technology is referred in U.S. Pat. Nos. 6,770,959, 6,989,294, 6,933,594 and 6872661.

However, the pads 12 have a thickness of about 1 μm to 5 μm, and have a poor bonding with the encapsulant 15, delamination can easily occur between the pads 12 and the encapsulant 15, even causing the break of the bonding wires 14. Furthermore, the manufacturing cost is increased by the use of costly metals such as Au, Pd and the like as an etching resist layer for removing the copper carrier to form the pads 12.

To improve the forgoing problems, a fabrication method is disclosed in U.S. Pat. No. 6,498,099, as shown in FIG. 2A to FIG. 2D'. The method comprises: providing a copper carrier 20, etching a top surface of the copper carrier 20 to form pads 22 as electrical terminals and a die pad 21 for mounting a chip, and plating a plating layer 27 such as Ni or Ag and the like on the top surface of the copper carrier 20; mounting a semiconductor chip 23 on the die pad 21, and connecting the chip 23 to the pads 22 by bonding wires 24, so as to make the bonding wires 24 and the pads 22 effectively bonded, and forming an encapsulant 25 encapsulating the semiconductor chip 23, the bonding wires 24 and the top surface of the copper carrier 20; etching an bottom surface of the copper carrier 20 to expose the encapsulant 25 while remaining the pads 22 and the die pad 21; and forming electroless aurum (Au) plating on the bottom surface of the pads for implanting solder balls 26 to allow the semiconductor package to be solder bonded to a printed circuit carrier (PCB) 28 by solder joints formed by reflowing the solder balls 26.

Unlike U.S. Pat. No. 5,830,800 using Au/Pd as an etching resist layer, the fabrication method uses a nickel (Ni) plating layer or a silver plating layer, and thus reduces the costs. However, there is a poor bonding between the plating layer, such as nickel or silver, and the encapsulant, delamination is caused due to thermal stress, and it further causes moisture penetrating (as shown in FIG. 2C'). Moreover, after the package is solder bonded to the PCB 28, due to the poor bonding between the encapsulant 25 and the silver layer, an incident of the pad 22 dropping off as shown in FIG. 2D' is happened, so as to cause the package to be invalid. Furthermore, in the fabrication method, die-mounting, wire-bonding and molding processes should be performed on the half etched copper carrier, because the thickness of the copper carrier is reduced a half so as to make the copper carrier be pliable and thus is difficult for transportation during fabricating, and causes the copper carrier to bend because of heat affecting. What is more, when I/O terminals of the electrical terminal are increased, bonding wire cross may easily happen because of the design of the pads 22 arranged in an array, thus causing bonding wire short problem. The correlative reference such as U.S. Pat. No. 6,700,188 also has the same problem.

Therefore, how to provide a semiconductor package without chip carrier and a fabrication method thereof so as to reduce the manufacturing cost, avoid the delimitation problem, produce and transparent easily has become urgent.

SUMMARY OF THE INVENTION

An objective of the present invention is to provide a semiconductor package without a chip carrier and a fabrication method thereof, which does not require the use of costly Au and Pa as an etching resist layer, thus reduce the manufacturing costs.

Another objective of the present invention is to provide a semiconductor package without a chip carrier and a fabrication method thereof, which avoids the delamination between a plating layer and an encapsulant.

A further objective of the present invention is to provide a semiconductor package without a chip carrier and a fabrication method thereof, which avoids the dropping of electrical terminals when requiring rework.

Still another objective of the present invention is to provide a semiconductor package without a chip carrier and a fabrication method thereof which avoids the bending of copper carrier structure and is helpful to mass-production.

To achieve the aforementioned and the other objectives, the present invention provides a semiconductor package without a chip carrier, comprising: a plurality of metal studs spaced from each other; a first encapsulant having an top surface and a bottom surface opposing to the top surface encapsulating lateral surfaces of the metal studs, with top surfaces and bottom surfaces of the metal studs being exposed; bonding pads formed on and electrically connected to the metal studs; a semiconductor chip electrically connected to the bonding pads; and a second encapsulant formed on the first encapsulant and encapsulating the semiconductor chip and the bonding pads.

The semiconductor chip is electrically connected to the bonding pads on the metal studs by flip-chip or wire-bonding techniques. At least one of the bonding pads comprises a metal layer (such as a copper layer) and an anti-oxidant layer that covers the metal layer. The anti-oxidant layer may be a silver layer or an organic solderability preservative (OSP) film. Each of the bonding pads has a cross section greater than a cross section of one of the metal studs on which the bonding pad is formed, such that the bonding pad together with the metal stud form a T-shaped structure. Therefore, the bonding force between the bonding pads and the first encapsulant is enhanced, and the delamination problem is avoided.

In another embodiment, the present invention also provides a semiconductor package without a chip carrier, comprising: a plurality of metal studs spaced from each other; a first encapsulant having an top surface and a bottom surface opposing to the top surface encapsulating lateral surfaces of the metal studs, with top surfaces and bottom surfaces of the metal studs being exposed; bonding pads formed on and electrically connected to the metal studs; a second encapsulant formed on the first encapsulant and the bonding pads and exposing a part of each of the bonding pads; a built-up trace formed on the second encapsulant and the exposed part of each of the bonding pads; a plating layer that covers a terminal of the built-up trace; a semiconductor chip electrically connected to the plating layer; and a third encapsulant formed on a top surface of the second encapsulant and encapsulating the semiconductor chip and the built-up trace.

In the semiconductor package without the chip carrier, the plating layer is a silver layer or an organic solderability preservative (OSP) film.

The fabrication method of the semiconductor package without the chip carrier comprises: preparing a metallic carrier having a first surface and a second surface opposing the first surface, with grooves and metal studs corresponding to the grooves formed on the first surface; filling the grooves with a first encapsulant, with top surfaces of the metal studs being exposed from the first encapsulant; forming bonding pads on the exposed top surfaces of the metal studs, and electrically connecting the bonding pads to the metal studs; electrically connecting a semiconductor chip to the bonding pads on the metal studs; forming on the first surface of the metallic carrier a second encapsulant that encapsulates the semiconductor chip and the bonding pads; and removing the metallic carrier, so as to expose bottom surfaces of the metal studs and the first encapsulant.

The semiconductor chip is electrically connected to the bonding pads on the metal studs by flip-chip or wire-bonding techniques. At least one of the bonding pads comprises a metal layer (such as a copper layer) and an anti-oxidation layer that covers the metal layer. The anti-oxidation layer may be a silver layer or organic solderability preservative (OSP) film. Each of the bonding pads has a cross section greater than a cross section of one of the metal studs on which the bonding pad is formed, such that the bonding pad together with the metal stud form a T-shaped locking structure.

The present invention also provides a fabrication method of a semiconductor package without a chip carrier, comprising: preparing a metallic carrier having a first surface and a second surface opposing to the first surface, with grooves and metal studs corresponding to the grooves formed on the first surface; filling the grooves with a first encapsulant, with top surfaces of the metal studs being exposed from the first encapsulant; forming bonding pads on the metal studs and electrically connecting the bonding pads to the metal studs; forming a second encapsulant on the first encapsulant and a part of each of the bonding pads; forming built-up traces on the second encapsulant and the exposed part of each of the bonding pads; covering terminals of the built-up traces with a plating layer; electrically connecting a semiconductor chip to the plating layer; forming on the second encapsulant a third encapsulant that encapsulates the semiconductor chip and the built-up traces; and removing the metallic carrier, so as to expose bottom surfaces of the metal studs and the first encapsulant.

Therefore, the semiconductor package without chip carrier and the fabrication method thereof of the present invention are characterized by forming on a metallic carrier a plurality of grooves and corresponding metal studs by half etching. The metal stud is either an electrical terminal or a die pad. After filling a first encapsulant in the grooves, the first encapsulant is bonded to the metallic carrier via the metal studs directly without the need of spacing other metal material thereinbetween, thereby bonding strength between the first encapsulant and the metallic carrier in enhanced. Subsequently, a bonding pad is formed on each of the metal studs, which comprises a metal layer such as a copper layer and an anti-oxidant layer, such as a silver layer or an OSP film, covering the metal layer. A T-shaped locking structure is thus formed by the bonding pad and the metal stud and securely locked with the first encapsulant, so as to prevent delamination or a moisture penetration from occurrence. As a result, when in need of working the semiconductor package thus fabricated, concerns such as the scrap of the semiconductor package resulting from the drop-off of the terminals and solder joints on the printed circuit board (PCB) from the semiconductor package due to poor bonding between the plating layer and encapsulant. Then, die-mounting, wire-bonding and molding processes, forming a second encapsulant encapsulating a semiconductor chip are sequentially performed, while in the die-mounting, wire-bonding and molding processes, the half-etched grooves are filled with the first encapsulant, so the metallic carrier has a certain structural intension to overcome the drawbacks of having pliable metallic carrier that is difficult for transportation and mass-production as encountered in prior art techniques and, also reduce the manufacturing costs by not requiring the use of the costly metals such as Au and Pd etc. as an etching resist layer.

DESCRIPTION OF THE DRAWINGS

FIG. 2C' is a diagram showing a semiconductor package without chip carrier occurring delamination problem disclosed by U.S. Pat. No. 6,498,099;

FIG. 2D' is a diagram showing a semiconductor package without chip carrier occurring dropping problem of electrical terminals and solder when requiring rework disclosed by U.S. Pat. No. 6,498,099;

BEST MODE FOR CARRYING OUT THE INVENTION

The following illustrative embodiments are provided to illustrate the disclosure of the present invention when taken with reference to the accompanying drawings.

First Embodiment

FIG. 3A to FIG. 3I are diagrams showing a semiconductor package without a chip carrier and a fabrication method thereof according to a first embodiment of the present invention.

Figure 1:
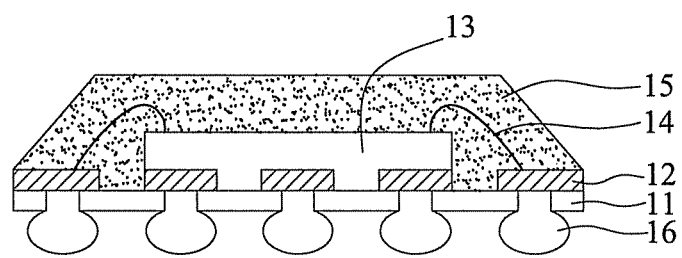
FIG. 1 is a diagram showing a semiconductor package without chip carrier disclosed by U.S. Pat. No. 5,830,800.
Figure 2A:
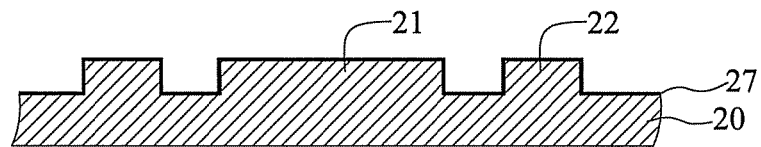
FIGS. 2A to 2D are diagrams showing a fabrication method of a semiconductor package disclosed by U.S. Pat. No. 6,498,099.
Figure 2B:
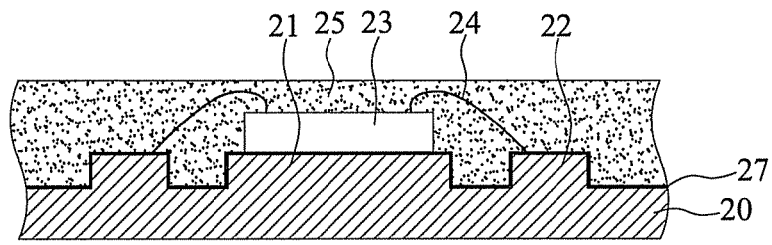
Figure 2C:
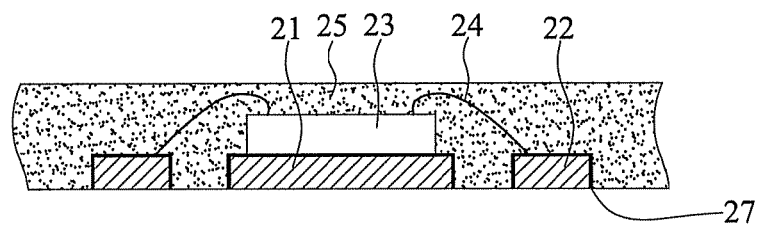
Figure 2C:
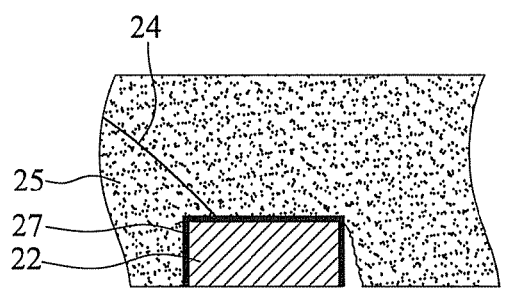
Figure 2D:
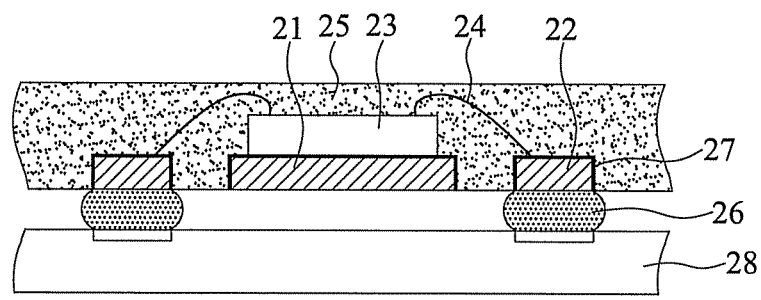
Figure 2D:
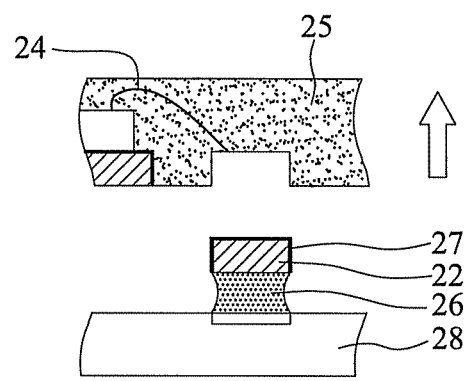
Figure 3A:
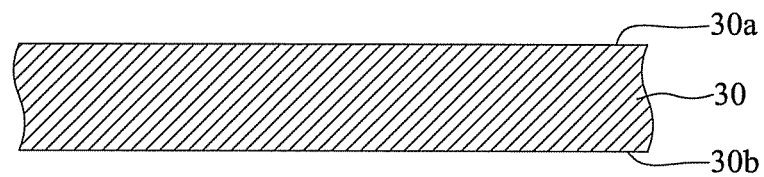
FIG. 3A to FIG. 3I are diagrams showing a semiconductor package without a chip carrier and a fabrication method thereof according to a first embodiment of the present invention, wherein, FIG. 3D' and FIG. 3E' are diagrams showing the forming of a buffering layer.

As shown in FIG. 3A, a metallic carrier 30 such as a copper layer is prepared, and the metallic carrier 30 has a first surface 30a and a second surface 30b opposing the first surface 30a.

Figure 3B:
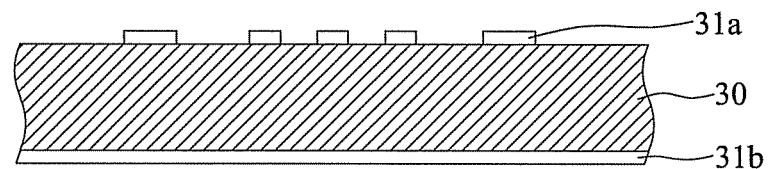

As shown in FIG. 3B, a patterned first resist layer 31a is formed on the first surface 30a of the metallic carrier 30. The patterned first resist layer 31a is defined with electrical terminals and the position of die pads. A second resist layer 31b is formed to cover the second surface 30b of the metallic carrier 30. The first resist layer 31a and the second resist layer 31b are, for example, a dry film.

Figure 3C:
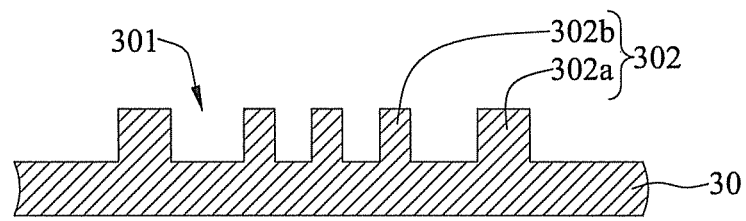

As shown in FIG. 3C, a part of the metallic carrier 30 uncovered by the first resist layer 31a is removed via a half-etching process, so as to form a plurality of grooves 301 and metal studs 302 corresponding to the grooves 301. The first resist layer 31a and the second resist layer 31b are then removed. Namely, the metal studs 302 are formed by the electrical terminals 302a and die pads 302b.

Figure 3D:
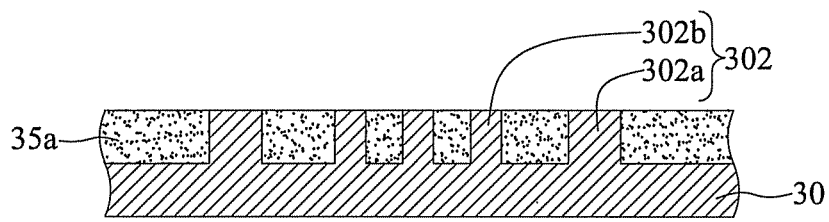

As shown in FIG. 3D, the grooves 301 are filled with a first encapsulant 35a, such as a molding compound or a solder mask, with the metal studs 302 being exposed therefrom. The molding compound is an epoxy resin or other polymeric material.

Figure 3E:
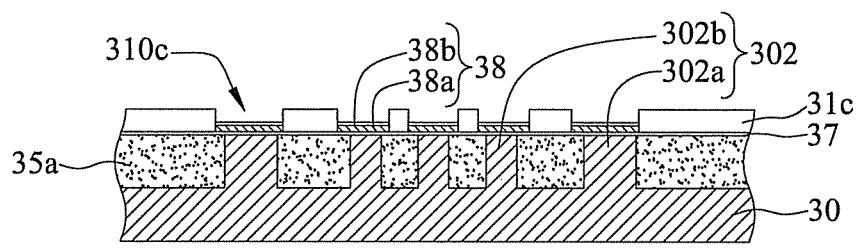
Figure 3D:
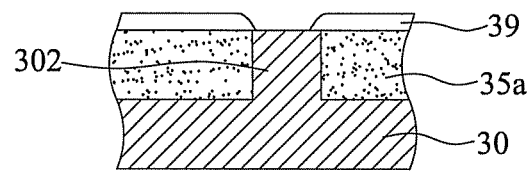
Figure 3E:
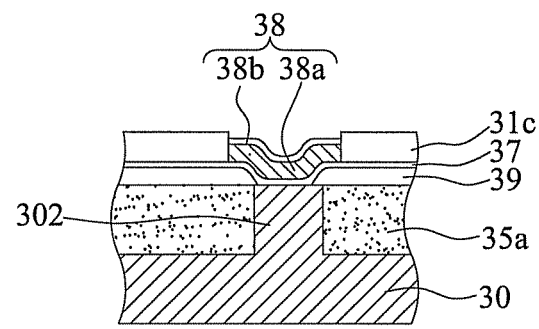

As shown in FIG. 3E, a conductive layer 37 such as a thin copper layer, is formed on top surfaces of the first encapsulant 35a and the metal studs 302 by electroless plating or sputtering techniques.

The conductive layer 37 is covered with a patterned third resist layer 31c such as a dry film while a part of the conductive layer 37 is exposed from the third resist layer 31c. The third resist layer 31c has a plurality of openings 310c that correspond to the metal studs 302 in position, and each of the openings 310c has an area greater than a cross section of one of the metal studs 302 corresponding to the opening 310c.

Then, a metal layer 38a such as a copper layer, is formed in the openings 310c of the third resist layer 31c by electro plating technique. An anti-oxidant layer 38b is then formed on the metal layer 38a, for example, a silver plating layer or an OSP film that covers the metal layer 38a formed by soaking technique, so as to form the bonding pads 38. The thickness of the metal layer 38a is about 10 μm to 50 μm. Each of the bonding pads 38 has a cross section greater than a cross section of one of the metal studs 302 on which the bonding pad 38 is formed, such that the bonding pad 38 together with the metal studs 302 form a T-shaped locking structure. Therefore, the bonding force between the first encapsulant 35a and the metal studs 302 is enhanced, and the delamination problem is avoided.

As shown in FIG. 3D' and FIG. 3E', in another embodiment, the bonding pads 38 are fabricated by forming a buffering layer 39 on top surfaces of the first encapsulant 35a and the metal studs 302, with the top surfaces of the metal studs 302 being exposed from the buffering layer 39, prior to forming the conductive layer 37. The buffering layer 39 may be made of benzo-cyclo-butene (BCB) or polyimide (PI), so as to allow the surfaces of the first encapsulant 35a and the metal studs 302 to become flat, and release the stress between the conductive layer 37, the bonding pads 38 and the first encapsulant 35a.

Figure 3F:
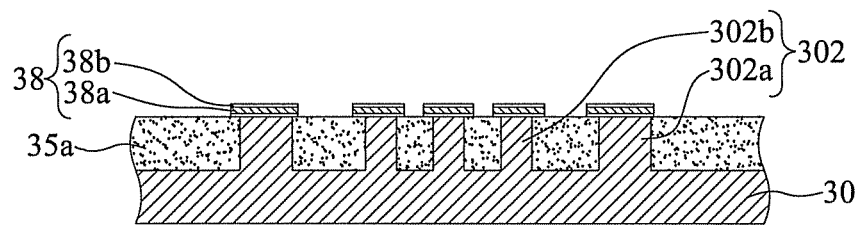

As shown in FIG. 3F, the third resist layer 31c and the conductive layer 37 covered by the third resist layer 31c are removed.

The anti-oxidant layer 38b may be formed on the metal layer 38a, and a plating layer such as silver is formed on the exposed metal layer 38a by spotting plating after the third resist layer 31c and the conductive layer 37 covered by the third resist layer 31c are removed.

Figure 3G:
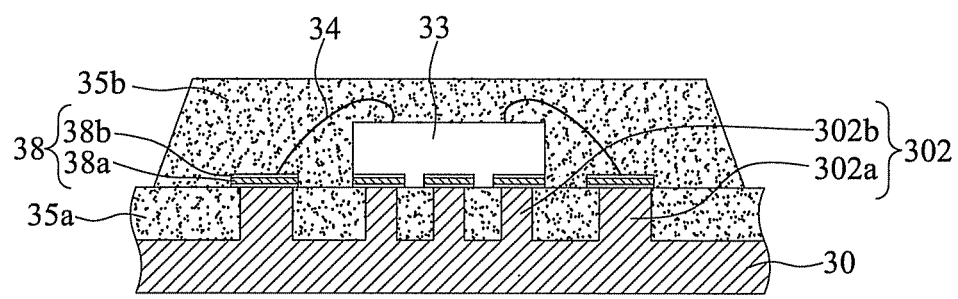

As shown in FIG. 3G, die bonding, wire-bonding and molding processes are performed and a semiconductor chip 33 is mounted on the bonding pads 38 corresponding to the die pads 302b. The semiconductor chip 33 is electrically connected to the bonding pads 38 corresponding to the electrical terminals 302a by bonding wires 34. Then, a second encapsulant 35b that encapsulates the semiconductor chip 33 and the bonding wires 34 is formed on the first encapsulant 35a and the bonding pads 38.

Figure 3H:
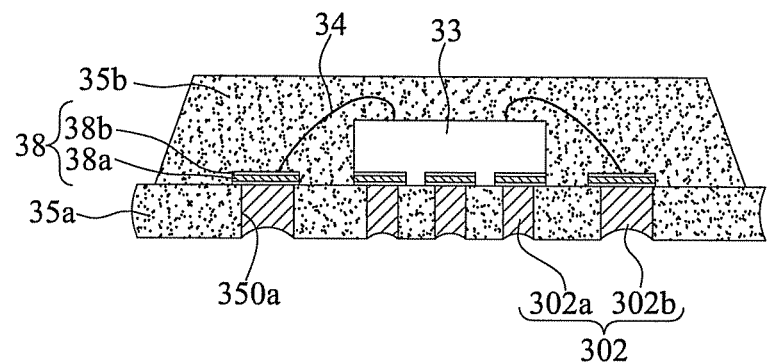

As shown in FIG. 3H, the second surface 30b of the metallic carrier 30 is etched and removed, to expose bottom surfaces of the metal studs 302 and the first encapsulant 35a. Accordingly, a plurality of through holes 350a are formed as in the first encapsulant 35a, allowing the through holes 350a to penetrate the top surface and bottom surface of the first encapsulant 35a and receive the metal studs 302.

Figure 3I:
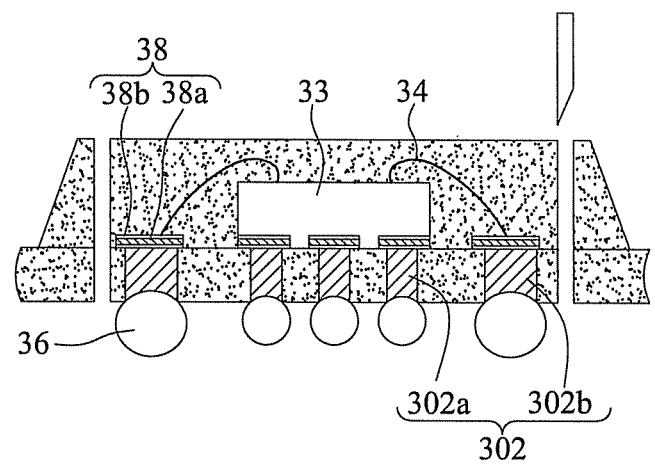

As shown in FIG. 3I, solder balls 36 are implanted on the bottom surfaces of the metal studs 302, and the semiconductor package is singularized. Accordingly, the solder balls 36 may serve as electrical connections between I/O terminals of the semiconductor chip and an external device.

By the aforementioned fabrication method, a semiconductor package without a chip carrier of the present invention has: a plurality of metal studs 302 spaced from each other; a first encapsulant 35a having a top surface and a bottom surface opposing the top surface, for encapsulating lateral surfaces of the metal studs 302 and with top surfaces and bottom surfaces of the metal studs 302 being exposed from the first encapsulant 35a; bonding pads 38 formed on and electrically connected to the metal studs 302; a semiconductor chip 33 electrically connected to the bonding pads 38; and a second encapsulant 35b formed on the top surface of the first encapsulant 35a, for encapsulating the semiconductor chip 33 and the bonding pads. At least one of the bonding pads 38 comprises a metal layer 38a such as a copper layer, and an anti-oxidant layer 38b that covers the metal layer 38a. The anti-oxidant layer 38b may be a silver (Ag) layer or an organic solderability preservative (OSP) film. Accordingly, the semiconductor chip 33 is electrically connected to the bonding pads 38, and solder balls 36 are implanted on the bottom surfaces of the metal studs 302 for electrically connecting the semiconductor package without the chip carrier with an external device.

In the fabrication method of forming a buffering layer as shown in FIG. 3D' and FIG. 3E', the semiconductor package further comprises a buffering layer 39 formed and sandwiched between the first encapsulant 35a, the bonding pads 38 and the second encapsulant 35b, with a part of each of the metal studs 302 being exposed from the buffering layer 39. The buffering layer 39 may be made of benzo-cyclo-butene (BCB) or polyimide (PI).

Therefore, the semiconductor package without chip carrier and the fabrication method thereof of the present invention are characterized by half-etching a metallic carrier to form a plurality of grooves and corresponding metal studs. The metal studs are either electrical terminals or die pads. The grooves are filled with an encapsulant bonded to the metallic carrier via the metal studs directly without the need of other metal material therebetween, thereby bonding strength between the first encapsulant and the metallic carrier is enhanced. Bonding pads are formed on the metal studs, at least one of which comprises a metal layer such as a copper layer and an anti-oxidant layer, such as a silver layer or an OSP film, covering the metal layer. A T-shaped locking structure is thus formed by each of the bonding pads and one of the metal studs corresponding to the bonding pad, and securely locked with the first encapsulant, so as to prevent delamination or a moisture penetration from occurrence. As a result, when in need of working the semiconductor package thus fabricated, concerns such as the scrap of the semiconductor package resulting from the drop-off of the terminals and solder joints on the printed circuit board (PCB) from the semiconductor package due to the poor bonding between the plating layer and encapsulant. Then, die-mounting, wire-bonding and molding processes, forming a second encapsulant encapsulating a semiconductor chip are sequentially performed, while in the die-mounting, wire-bonding and molding processes, the half-etched grooves are filled with the first encapsulant, so the metallic carrier has a certain structural intension to overcome the drawbacks of having pliable metallic carrier that is difficult for transportation and mass-production as encountered in prior art techniques and, also reduce the manufacturing costs by not requiring the use of the costly metals such as Au and Pd etc. as an etching resist layer.

Second Embodiment

Figure 4:
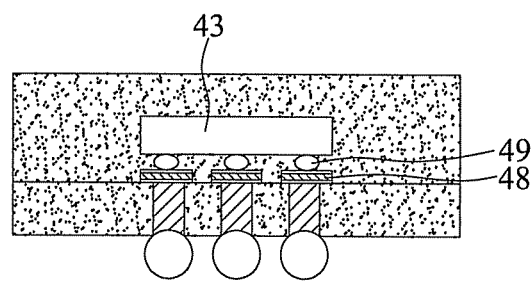
FIG. 4 is a diagram showing a semiconductor package without a chip carrier and a fabrication method thereof according to a second embodiment of the present invention.

FIG. 4 is a diagram showing a semiconductor package without a chip carrier and a fabrication method thereof according to a second embodiment of the present invention.

The present embodiment is substantially similar to the first embodiment, except that a semiconductor chip is electrically connected to the bonding pads on the metal studs by flip-chip technique.

The semiconductor chip 43 of the present embodiment is mounted on the bonding pads 48 by flip-chip technique. More specifically, the active surface of the semiconductor chip 43 faces the bonding pads 48, and is electrically connected to the bonding pads 48 via a plurality of solder studs 49.

Compared with the bonding wires that connect the semiconductor chip and the bonding pads, the flip-chip technology using solder studs further shortens the electrical connection path between the semiconductor chip and the bonding pads, and thus it is more capable of ensuring a high quality of the electrical connection between the semiconductor chip and the bonding pad. Moreover, it is also applicable to allow the inactive surface of the semiconductor chip to be exposed from the second encapsulant encapsulating the semiconductor chip, so as to allow the heat produced from the semiconductor chip during operation to be effectively dissipated via the exposed inactive surface of the semiconductor chip, thereby, improving the heat dissipation efficiency.

Third Embodiment

Figure 5A:
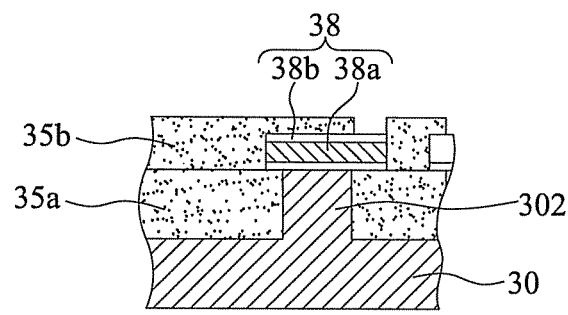
FIG. 5A to FIG. 5C are diagrams showing a semiconductor package without a chip carrier and a fabrication method thereof according to a third embodiment of the present invention, wherein, FIG. 5A' to FIG. 5C' are diagrams showing the forming of a buffering layer.
Figure 5B:
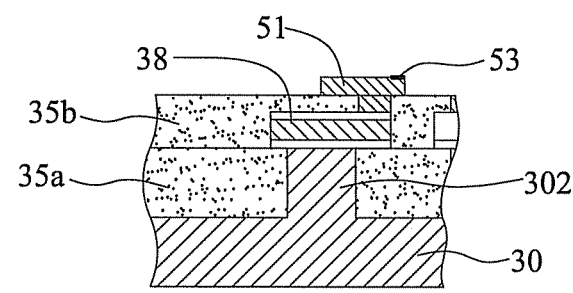
Figure 5C:
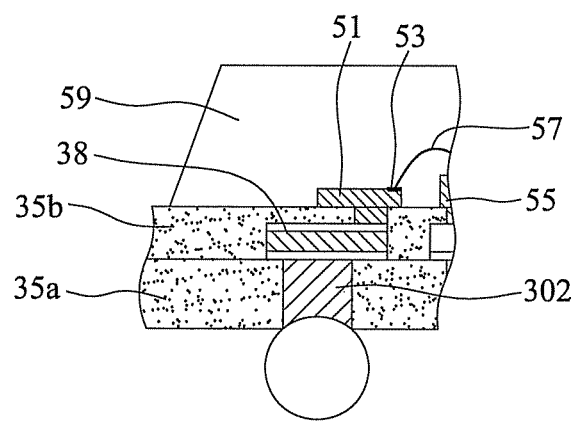
Figure 5A:
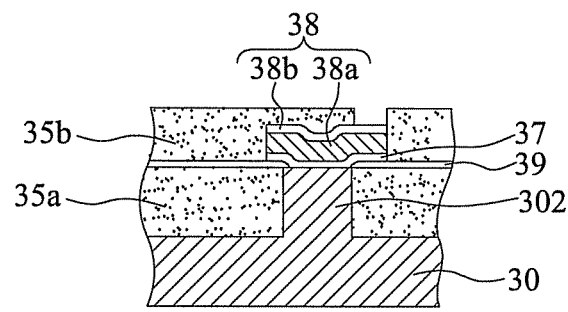
Figure 5B:
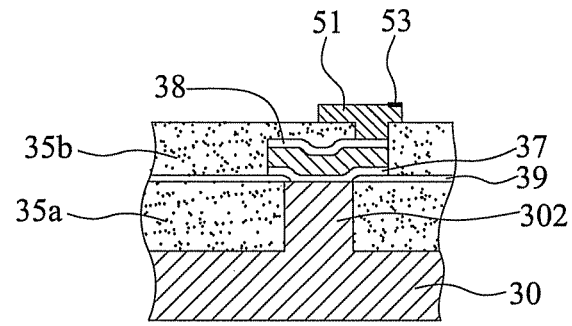
Figure 5C:
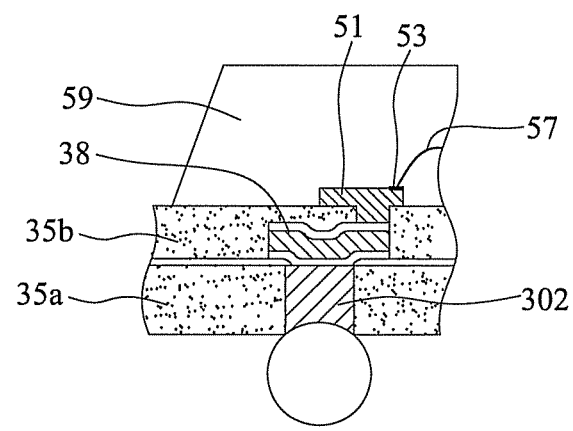

FIG. 5A to FIG. 5C are diagrams showing a semiconductor package without a chip carrier and a fabrication method thereof according to a third embodiment of the present invention.

The present embodiment is substantially similar to the first embodiment, except that the present embodiment comprises the formation of built-up traces.

According to the steps of FIG. 3A to FIG. 3F, a plurality of grooves 301 and corresponding metal studs 302 are formed on the metallic carrier 30. After the grooves 301 are filled with the first encapsulant 35a, and the metal studs 302 are exposed from the first encapsulant 35a, a conductive layer 37 such as a thin copper layer is formed on top surfaces of the first encapsulant and the metal studs by electroless plating or sputtering techniques. Then, a patterned third resist layer 31c is formed on the conductive layer 37, and a plurality of openings 310c are formed in the third resist layer 31c to define positions of conductive traces and a die pad. Then, a metal layer 38b is formed in the openings 310c of the third resist layer 31c by means of, for example, electro plating technique. An anti-oxidant layer 38b is then formed on the metal layer 38a, for example, a silver plating layer or an OSP film after covering the metal layer 38a by soaking technique, so as to form the bonding pads 38. Then, the third resist layer 31c is removed, and the conductive layer 37 covered is etched and removed.

Referring to FIG. 5A again, a second encapsulant 35b is formed on the first encapsulant 35a and the bonding pads 38, and a part of each of the bonding pads 38 is exposed from the second encapsulant 35b.

As shown in FIG. 5B, referring to the steps of FIG. 3A to FIG. 3F, built-up traces 51 are formed on the second encapsulant 35b and the parts of the bonding pads 38 exposed from the second encapsulant 35b. A plating layer 53, such as a silver layer or an OSP film, covers terminals of the built-up traces 51.

As shown in FIG. 5C, a semiconductor chip 55 is electrically connected to the plating layer 53 on the built-up traces 51 and a third encapsulant 59 for encapsulating the semiconductor chip 55 and the built-up trace 51 is formed on the second encapsulant 35b. The metallic carrier 30 is then removed to expose bottom surfaces of the metal studs 302 and the first encapsulant 35a. The steps thereafter are the same as the aforementioned embodiments. Then ball implanting and singulation processes are performed, and thus a semiconductor package without a chip carrier that has conductive traces is fabricated at a low cost.

In addition, as shown in FIG. 5A' to FIG. 5C', the present embodiment further comprises forming a buffering layer 39 for exposing the metal studs 302 on the top surface of the first encapsulant 35a, prior to forming the bonding pads 38. The buffering layer 39 may be made of BCB or PI, so as to make the surfaces of the first encapsulant 35a and the metal studs 302 flat, and release the stress between the conductive layer 37, the bonding pads 38 and the first encapsulant 35a. The formation of the buffering layer 39 is shown in FIG. 3D' to FIG. 3E', and thus further description is hereby omitted. By the aforementioned fabrication method, a semiconductor package without a chip carrier of the present invention is obtained, which comprises: a plurality of metal studs 302 spaced from etch other; a first encapsulant 35a having an top surface and a bottom surface opposing the top surface, and encapsulating lateral surfaces of the metal studs, with top surfaces and bottom surfaces of the metal studs 302 being exposed therefrom; bonding pads 38 formed on and electrically connected to the metal studs 302; a second encapsulant 35b formed on the first encapsulant 35a and the bonding pads 38 and exposing a part of each of the bonding pads 38; built-up traces 51 formed on the exposed parts of the bonding pads 38 and the second encapsulant 35b surrounding thereof; a plating layer 53 that covers terminals of the built-up trace 51; a semiconductor chip 55 electrically connected to the plating layer 53 on the built-up trace 51; and a third encapsulant 59 formed on the top surface of the second encapsulant 35b and encapsulating the semiconductor chip 55 and the built-up traces 51.

In the fabrication method of forming the buffering layer as shown in FIG. 5A' to FIG. 5C', the attained semiconductor package further comprises a buffering layer 39, which is formed and sandwiched between the first encapsulant 35a, the bonding pads and the second encapsulant 35b, and exposes the metal studs 302. The buffering layer 39 may be made of BCB or PI.

The above-described descriptions of the detailed embodiments are only to illustrate the preferred implementation according to the present invention, and it is not to limit the scope of the present invention, accordingly, all modifications and variations completed by those with ordinary skill in the art should fall within the scope of present invention defined by the appended claims.

What is claimed is:

1. A semiconductor package without a chip carrier, comprising:
   a plurality of metal studs spaced from each other;
   a first encapsulant having an top surface and a bottom surface opposing the top surface, for encapsulating lateral surfaces of the plurality of metal studs, with top surfaces and bottom surfaces of the plurality of metal studs being exposed from the first encapsulant;
   a plurality of bonding pads formed on and electrically connected to the plurality of metal studs;
   a semiconductor chip electrically connected to the plurality of bonding pads; and
   a second encapsulant formed on the first encapsulant and encapsulating the semiconductor chip and the plurality of bonding pads,
   wherein the first encapsulant is free from encapsulating the semiconductor chip and the plurality of bonding pads.

2. A semiconductor package without a chip carrier, comprising:
   a plurality of metal studs spaced from each other;
   a first encapsulant having an top surface and a bottom surface opposing the top surface, for encapsulating lateral surfaces of the plurality of metal studs, with top surfaces and bottom surfaces of the plurality of metal studs being exposed from the first encapsulant;
   a plurality of bonding pads formed on and electrically connected to the plurality of metal studs;
   a second encapsulant formed on the first encapsulant and the plurality of bonding pads and exposing a part of each of the plurality of bonding pads;
   a built-up trace formed on the second encapsulant and the exposed part of each of the plurality of bonding pads;
   a plating layer covering a terminal of the built-up trace;
   a semiconductor chip electrically connected to the plating layer; and
   a third encapsulant formed on a top surface of the second encapsulant and encapsulating the semiconductor chip and the built-up trace.

3. The semiconductor package as claimed in claim 1, further comprising a plurality of solder balls implanted on bottom surfaces of the plurality of metal studs.

4. The semiconductor package as claimed in claim 1, wherein the first encapsulant is one selected from the group consisting of a molding compound and a solder mask.

5. The semiconductor package as claimed in claim 1, wherein at least one of the plurality of bonding pads comprises a metal layer and an anti-oxidant layer that covers the metal layer.

6. The semiconductor package as claimed in claim 5, wherein the metal layer is a copper layer.

7. The semiconductor package as claimed in claim 5, wherein the anti-oxidant layer is a silver layer or an OSP film.

8. The semiconductor package as claimed in claim 1, wherein each of the plurality of bonding pads has a cross section greater than a cross section of one of the plurality of metal studs on which the plurality of bonding pads is formed, such that the plurality of bonding pads together with the plurality of metal studs form a T-shaped locking structure.

9. The semiconductor package as claimed in claim 1, further comprising a buffering layer which is formed and sandwiched between the first encapsulant, the plurality of bonding pads and the second encapsulant, and exposes a part of each of the plurality of metal studs.

10. The semiconductor package as claimed in claim 9, wherein the buffering layer is made of BCB or PI.

11. The semiconductor package as claimed in claim 2, further comprising solder balls formed on bottom surfaces of the plurality of metal studs.

12. The semiconductor package as claimed in claim 2, wherein the first encapsulant is one selected from the group consisting of a molding compound and a solder mask.

13. The semiconductor package as claimed in claim 2, wherein at least one of the plurality of bonding pads comprises a metal layer and an anti-oxidant layer that covers the metal layer.

14. The semiconductor package as claimed in claim 13, wherein the metal layer is a copper layer.

15. The semiconductor package as claimed in claim 13, wherein the anti-oxidant layer is a silver layer or an OSP film.

16. The semiconductor package as claimed in claim 2, wherein each of the plurality of bonding pads has a cross section greater than a cross section of one of the plurality of metal studs on which the plurality of bonding pads is formed, such that the plurality of bonding pads together with the plurality of metal studs form a T-shaped locking structure.

17. The semiconductor package as claimed in claim 2, further comprising a buffering layer that is formed and sandwiched between the first encapsulant, the plurality of bonding pads and the second encapsulant, and exposes a part of each of the plurality of metal studs.

18. The semiconductor package as claimed in claim 17, wherein the buffering layer is BCB or PI.

19. The semiconductor package as claimed in claim 2 wherein the plating layer is a silver layer or an OSP film.

* * * * *